United States Patent [19]
Gersbach

[11] Patent Number: 5,729,159
[45] Date of Patent: Mar. 17, 1998

[54] MULTIPLE REFERENCE SENSE AMPLIFIER

[75] Inventor: John E. Gersbach, Burlington, Vt.

[73] Assignee: International Business Machines Corporation, Armonk, N.Y.

[21] Appl. No.: 707,366

[22] Filed: Sep. 4, 1996

Related U.S. Application Data

[63] Continuation of Ser. No. 582,222, Jan. 3, 1996, abandoned, which is a continuation of Ser. No. 386,238, Feb. 9, 1995, abandoned.

[51] Int. Cl.$^6$ .................................................. G01R 19/00
[52] U.S. Cl. ........................... 327/52; 327/56; 327/57; 327/74
[58] Field of Search .................................. 327/51, 52, 53, 327/54, 55, 56, 57, 74, 75, 76; 365/189.05, 189.07, 205

[56] References Cited

U.S. PATENT DOCUMENTS

| | | | |
|---|---|---|---|
| 3,816,761 | 6/1974 | Ahmed | 327/76 |
| 4,123,799 | 10/1978 | Peterson | 365/205 |
| 4,366,444 | 12/1982 | Schade, Jr. | 330/256 |
| 4,463,383 | 7/1984 | Soneda et al. | 348/300 |
| 4,669,065 | 5/1987 | Ohsawa | 365/149 |
| 4,743,784 | 5/1988 | Obara et al. | 327/57 |
| 4,764,693 | 8/1988 | Iwata | 307/530 |
| 4,845,675 | 7/1989 | Krenik et al. | 327/57 |
| 4,907,121 | 3/1990 | Hrassky | 361/154 |
| 5,049,761 | 9/1991 | Zitta | 327/172 |
| 5,204,594 | 4/1993 | Carobolante | 318/254 |
| 5,206,551 | 4/1993 | Chern | 307/530 |
| 5,243,573 | 9/1993 | Makihara et al. | 365/205 |
| 5,377,150 | 12/1994 | McClure | 327/51 |
| 5,414,663 | 5/1995 | Komarek et al. | 365/210 |

*Primary Examiner*—Timothy P. Callahan
*Assistant Examiner*—Kenneth B. Wells
*Attorney, Agent, or Firm*—Whitham, Curtis, Whitham & McGinn; Howard J. Walter, Esq.

[57] ABSTRACT

A sensing amplifier that works over a large operating frequency having a plurality of reference inputs, at least one signal input and at least one signal output, where the amplifier comprises a plurality of transistors to internally compare the signal input to the average value of the reference inputs and producing an output based on the comparison. In some cases, the output can be a latched binary signal.

2 Claims, 2 Drawing Sheets

1

MULTIPLE REFERENCE SENSE AMPLIFIER

CROSS REFERENCE TO RELATED APPLICATIONS

This application is a continuation of U.S. patent application Ser. No. 08/582,222, filed Jan. 3, 1996, now abandoned, which is a continuation of U.S. patent application Ser. No. 08/386,238, filed Feb. 9, 1995, now abandoned.

BACKGROUND OF THE INVENTION

1. Field of the Invention

The present invention generally relates to sense amplifiers, and more particularly, to a sense amplifier that internally compares a signal input to a plurality of reference inputs, and produces an output based on the comparison.

2. Description of the Prior Art

CMOS read only memories (ROMs) have generally been designed with an array element comprising a single transistor for a "1" and no transistor for a "0". Bits are stored according to the presence or absence of a transistor switch at each row-column intersection. Therefore, in the case of a logical "1", the transistor is turned on to discharge its associated bit line, while in the logical "0" case, the transistor does not discharge the bit line. Using such a standard array element, the "1" signal amplitude would eventually rise to the full supply voltage, $V_{DD}$.

A commonly chosen reference signal for a sensing operation (e.g. a memory array access signal) has been a bit line that is discharged by the same current drive as the logical "1", but with twice the capacitive load to halve its rate of development so that the reference signal is half way between the logical "1" and logical "0" signals after some time duration. As shown in FIG. 1, for example, at time $x_1$ the reference signal voltage is approximately half-way between the "1" and "0" signals.

Alternatively, reference levels can be created as in dynamic random access memories (DRAMs) by providing a reference cell having half the capacitance of a normal data cell.

The resultant difference signal between the "1" signal and the reference signal achieves a maximum and then degrades with time as the reference amplitude approaches that of the "1" signal and must therefore be ignored after a certain point in its development. For example, referring again to FIG. 1, it can be seen that the "1" difference signal at $x_0$ is greater than the "1" difference signal at $x_2$. The use of such a reference signal can be made to work well but requires that the signal be latched before the difference between the "1" signal and the reference signal begins to degrade. This is usually accomplished by self-restoring circuits that do not take advantage of a widening clock or select pulse as the frequency of operation decreases. Self-restoring or self-timed circuits depend on the delay of circuits to perform timing functions such as latching the array output signal. This is a disadvantage for Read Only Memories (ROMs) that are required to function over a wide range of frequencies or where slower chips are used in slower applications.

In light of the foregoing, there exists a need for a sense amplifier that is capable of function over a wide range of frequencies as well as providing a reference signal that does not dissipate over time.

SUMMARY OF THE INVENTION

The present invention is directed to a sense amplifier with a plurality of reference inputs that works over a larger operating frequency and where a reference signal is provided that does not dissipate over time, which substantially obviates one or more of the problems due to the limitations and disadvantages of the related art.

To achieve these and other advantages and in accordance with the purpose of the invention embodied and broadly described herein, in one embodiment of the invention, there is provided a sensing amplifier having a plurality of reference inputs, at least one signal input and at least one signal output, where the amplifier includes means to internally compare the signal input to the average value of the reference inputs and producing an output based on the comparison. In some cases, the output can be a latched binary signal.

In another aspect of the invention, there is provided a method for producing an output of a sense amplifier, the method comprising the steps of: (1) reading a plurality of reference input signals; (2) averaging the value of the reference signals; (3) reading a signal input; (4) comparing the signal input to the average reference value; and (5) producing an output based on the comparison.

It is to be understood that both the foregoing general description and the following detailed description are exemplary and explanatory and are intended to provide further explanation of the invention as claimed.

BRIEF DESCRIPTION OF THE DRAWING

The foregoing and other objects, aspects and advantages will be better understood from the following detailed description of the embodiments of the invention with reference to the following drawings.

DETAILED DESCRIPTION OF AN EMBODIMENT OF THE INVENTION

Figure 2:
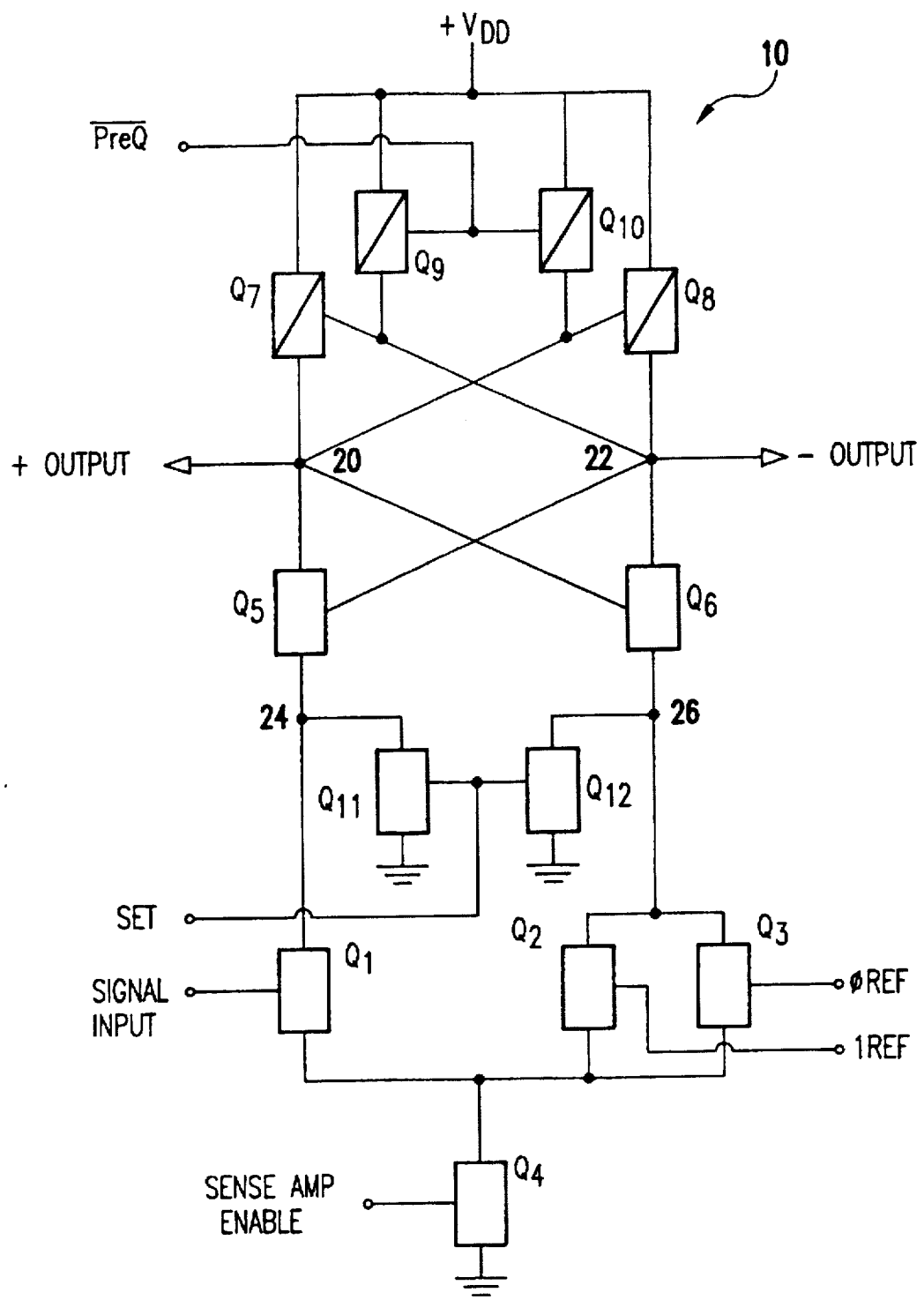
FIG. 2 is a circuit drawing showing a multiple reference sense amplifier according to the invention.

Referring now to the drawings, and more particularly to FIG. 2, there is shown a schematic diagram of the multiple reference sense amplifier according to the present invention and designated generally as reference numeral 10. The main amplifier comprises transistors $Q_1$, $Q_2$, and $Q_3$. Transistor $Q_1$ is connected to the signal input and transistors $Q_2$ and $Q_3$ are connected to individual "1" and "0" reference lines (1REF and 0REF), which are designed to look identical to logical "1" and "0" signals, respectively. By way of example and not limitation, two reference inputs are shown in the present embodiment. However, it can be appreciated that any multiple number of reference inputs may be used in accordance with the present invention.

Figure 1:
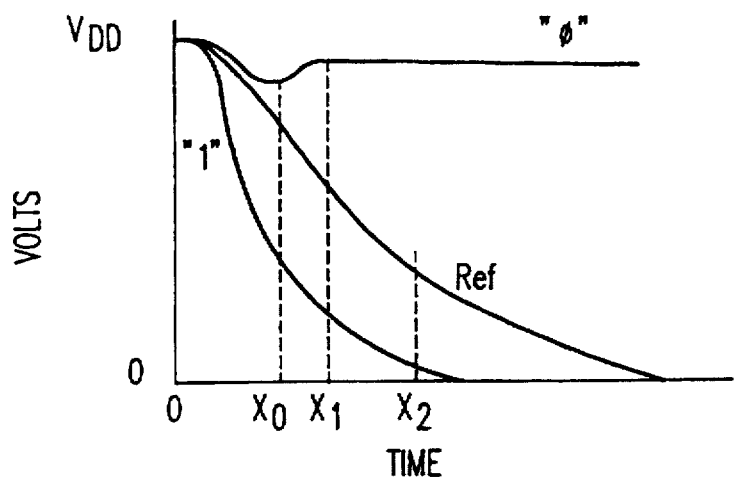
FIG. 1 is a voltage-time graph comparing the "0", "1", and "reference" signals as in the prior art.
Figure 3:
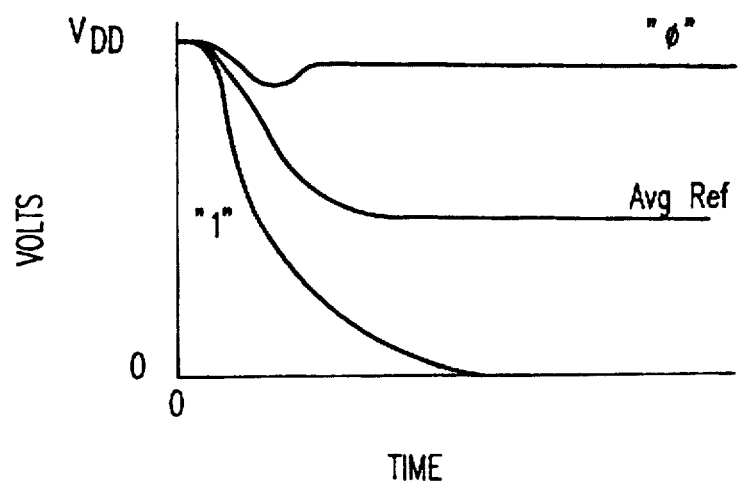
FIG. 3 is a voltage-time graph comparing the "0", "1", and "average" reference signals according to the present invention.

Transistors $Q_2$ and $Q_3$ function to produce an average current by averaging the reference input voltages. Specifically, the sizes of transistors $Q_2$ and $Q_3$ are selected to average the reference input voltages, compare this average reference voltage to the input signal voltage at $Q_1$, and produce an appropriate output current difference as an input to the latch circuit comprising transistors $Q_5$–$Q_8$. Given equal channel lengths, the widths of transistors $Q_2$ and $Q_3$ should be equal to each other and half that of transistor $Q_1$. The resulting "1", "0", and average reference signals are shown in FIG. 3.

Referring again to FIG. 2, the amplifier is driven by a SENSE AMP ENABLE input to the gate of transistor $Q_4$.

This input goes positive at a time when sufficient voltage has developed at the signal and reference inputs.

The amplifier outputs may be connected to a latch circuit comprising transistors $Q_5$, $Q_6$, $Q_7$, and $Q_8$. The cross-coupled latch nodes 20 ('+ output') and 22 ('− output') are restored to $V_{DD}$ by transistors $Q_9$ and $Q_{10}$ prior to the sense amplifier enabling pulse. As the sense amplifier is enabled, some current flows in both transistors $Q_5$ and $Q_6$ but the difference in these currents due to the signal causes a difference voltage to develop with time at the latch nodes 20 and 22 until the full power supply signal voltage is achieved. Transistors $Q_{11}$ and $Q_{12}$ may be required to hold the static state of the latch after the SENSE AMP ENABLE input goes inactive.

The operation of the amplifier will now be described with reference to FIGS. 2 and 3. For the maximum possible signal, that is, where the signal has fully developed, the "0" reference signal is at $V_{DD}$, the "1" reference signal has fallen to zero volts, and the actual "0" or "1" input signals are similarly at $V_{DD}$ and zero volts, respectively.

The case of a "0" input signal will now be described in greater detail. The signal input at the gate of transistor $Q_1$ is at $V_{DD}$, the "1" reference signal at the gate of transistor $Q_2$ is at zero volts, and the "0" reference signal at the gate of transistor $Q_3$ is at $V_{DD}$. Given these parameters, when SENSE AMP ENABLE at the gate of $Q_4$ rises and $Q_4$ is conducting, there is no conduction in $Q_2$, and $Q_4$'s current divides between $Q_1$ and $Q_3$ in a manner proportional to their respective widths. As discussed above, since $Q_1$ is twice as wide as $Q_3$, $Q_1$ will conduct two-thirds of $Q_4$'s current while $Q_3$ will conduct the remaining one-third of $Q_4$'s current.

Output nodes 20 and 22 will both start out at $V_{DD}$, having been precharged (PREQ) to that value by transistors $Q_{10}$ and $Q_9$ respectively. $Q_1$'s current flows through $Q_5$ to output node 20 causing it to begin discharging. $Q_3$'s current flows through $Q_6$ to output node 22 causing it to also begin discharging. Since node 20 is receiving twice the current that node 22 is receiving, it will discharge twice as fast. When node 20 falls below $V_{DD}$ minus the threshold voltage of $Q_8$, $Q_8$ will turn on, preventing further discharge of node 22 and pulling it up towards $V_{DD}$ while node 20 continues to discharge to zero volts. As node 20 falls, conduction is inhibited in transistor $Q_6$. Conversely, as node 22 rises, conduction is enhanced in transistor $Q_5$ aiding in the regeneration action of the latch formed by transistors $Q_5$ to $Q_8$.

After the voltages are substantially developed at latch nodes 20 and 22, SENSE AMP ENABLE may be reduced to zero volts causing $Q_4$ to stop conducting. The latch voltages may be maintained indefinitely by raising the SET input at the gates of $Q_{11}$ and $Q_{12}$ to $V_{DD}$ and causing nodes 24 and 26 to be held to zero volts. SET must be brought to zero volts again before SENSE AMP ENABLE rises on the following cycle.

The case of a "1" input signal will now be described in greater detail. The signal input at the gate of transistor $Q_1$ is at zero volts. The reference voltages are identical to the previous "0" case, i.e. the "1" reference at the gate of transistor $Q_2$ is at zero volts, and the "0" reference at the gate of transistor $Q_3$ is at $V_{DD}$. Therefore, when SENSE AMP ENABLE at the gate of $Q_4$ rises and $Q_4$ is conducting, there is no conduction in either $Q_1$ or $Q_2$, and $Q_4$'s current flows only through $Q_3$.

As in the previous "0" case, output nodes 20 and 22 will both start out at $V_{DD}$, having been precharged (PREQ) to that value by transistors $Q_{10}$ and $Q_9$ respectively. $Q_3$'s current flows through $Q_6$ to output node 22 causing it to start discharging. Since node 20 is receiving no current, it will remain at $V_{DD}$. When node 22 falls below $V_{DD}$ minus the threshold voltage of $Q_7$, $Q_7$ will turn on, ensuring no discharge of node 20 and holding it at $V_{DD}$, while node 22 continues to discharge to zero volts. As node 22 falls, conduction is inhibited in transistor $Q_5$. Conversely, with node 20 at $V_{DD}$, conduction remains steady in transistor $Q_6$ aiding in the regeneration action of the latch formed by transistors $Q_5$ to $Q_8$.

Latch voltages may be maintained indefinitely by raising the SET input at the gates of $Q_{11}$ and $Q_{12}$ to $V_{DD}$ as described for the previous "0" case.

In summary, if the input signal to $Q_1$ is a "0", then the '+ output' at node 20 is zero volts and the '− output' at node 22 is $V_{DD}$. Conversely, if the input signal to $Q_1$ is a "1", then the '+ output' at node 20 is $V_{DD}$ and the '− output' at node 22 is zero volts.

The nominal circuit described above will operate decisively with a 10 millivolt difference signal, i.e., "0"=$V_{DD}$, "1"=$V_{DD}$−10 mV, and the reference inputs average $V_{DD}$−5 mV. The time to resolve this signal to the full power supply level at the latch nodes 20 and 22 is very fast in current CMOS technologies.

With process variations, especially tracking errors between transistors $Q_1$, $Q_2$, and $Q_3$, it is reasonable to expect the circuit to work well with a 50 mV input amplitude within reasonable resolution times. Tracking errors refers to the slight variations in transistor thresholds due to variations in the manufacturing process.

While the invention has been described in terms of the above embodiments, those skilled in the art will recognize that the invention can be practiced with modification within the spirit and scope of the appended claims.

Having thus described my invention, what I claim as new and desire to secure by Letters Patent is as follows:

1. A sense amplifier for amplifying a bit signal from a memory array, comprising:

a first current path connected between a voltage source and ground;

a second current path connected between said voltage source and ground;

an input transistor connected in said first current path for receiving said bit signal from the memory array;

a plurality of reference transistors connected in parallel in said second current path and each connected to receive a respective reference voltage, wherein each of said plurality of reference transistors has a channel dimension smaller than that of said input transistor such that a current flow through said first current path is greater than a current flow through said second current path according to a value of said bit signal;

a latch connected to be discharged through said first current path and through said second current path for outputting a full logic level output for said bit signal and a full logic level complement for said bit signal; and a pair of transistors for precharging said latch.

2. A sense amplifier for amplifying a bit signal from a memory array, comprising:

a first current path connected between a voltage source and ground;

a second current path connected between said voltage source and ground;

an input transistor connected in said first current path for receiving said bit signal from the memory array;

a plurality of reference transistors connected in parallel in said second current path and each connected to receive a respective reference voltage, wherein each of said plurality of reference transistors has a channel dimension smaller than that of said input transistor such that a current flow through said first current path is greater than a current flow through said second current path according to a value of said bit signal;

a latch connected to be discharged through said first current path and through said second current path for outputting a full logic level output for said bit signal and a full logic level complement for said bit signal; and a pair of transistors for resetting said latch.

* * * * *